United States Patent
Tsai et al.

(10) Patent No.: US 8,866,297 B2
(45) Date of Patent: Oct. 21, 2014

(54) AIR-GAP FORMATION IN INTERCONNECT STRUCTURES

(71) Applicant: Taiwan Semiconductor Manufacturing Company, Ltd., Hsin-Chu (TW)

(72) Inventors: Cheng-Hsiung Tsai, Miaoli County (TW); Chung-Ju Lee, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/691,499

(22) Filed: Nov. 30, 2012

(65) Prior Publication Data

US 2014/0151888 A1    Jun. 5, 2014

(51) Int. Cl.
*H01L 29/51* (2006.01)
*H01L 23/522* (2006.01)
*H01L 21/768* (2006.01)

(52) U.S. Cl.
CPC .......... *H01L 23/522* (2013.01); *H01L 21/7682* (2013.01)
USPC .......................................... 257/762; 438/771

(58) Field of Classification Search
USPC .................. 257/774, 762, E21.581, E23.144, 257/E23.152, E21.158; 438/689, 421, 595, 438/619, 667
See application file for complete search history.

(56) References Cited

U.S. PATENT DOCUMENTS

| | | | | |
|---|---|---|---|---|
| 5,679,982 A * | 10/1997 | Gardner | ........................ | 257/758 |
| 6,228,763 B1 * | 5/2001 | Lee | ............... | 438/639 |
| 6,501,180 B1 * | 12/2002 | Kitch | ............ | 257/762 |
| 2010/0001409 A1 * | 1/2010 | Humbert et al. | ............. | 257/774 |
| 2010/0015813 A1 * | 1/2010 | McGinnis et al. | ............ | 438/771 |
| 2011/0183516 A1 * | 7/2011 | Lee | ............... | 438/653 |

OTHER PUBLICATIONS

Pantouvaki, M., et al., "Air-gap formation by UV-assisted decomposition of CVD material," Microelectronic Engineering, vol. 85, Issue 10, Oct. 2008, 3 pages.

* cited by examiner

*Primary Examiner* — Yu-Hsi D Sun
*Assistant Examiner* — Christina Sylvia
(74) *Attorney, Agent, or Firm* — Slater & Matsil, L.L.P.

(57) ABSTRACT

A structure includes a substrate, and a first metal line and a second metal line over the substrate, with a space therebetween. A first air gap is on a sidewall of the first metal line and in the space, wherein an edge of the first metal line is exposed to the first air gap. A second air gap is on a sidewall of the second metal line and in the space, wherein an edge of the second metal line is exposed to the second air gap. A dielectric material is disposed in the space and between the first and the second air gaps.

20 Claims, 10 Drawing Sheets

AIR-GAP FORMATION IN INTERCONNECT STRUCTURES

BACKGROUND

As the semiconductor industry introduces new generations of integrated circuits (ICs) having higher performance and greater functionality, the density of the elements that form the ICs is increased, while the dimensions and spacing between components or elements of the ICs are reduced. In the past, such reductions were limited only by the ability to define the structures photo-lithographically, device geometries having smaller dimensions created new limiting factors. For example, for any two adjacent conductive features, when the distance between the conductive features decreases, the resulting capacitance (a function of the dielectric constant (k value) of the insulating material divided by the distance between the conductive features) increases. The increased capacitance results in an increased capacitive coupling between the conductors, increased power consumption, and an increase in the resistive-capacitive (RC) time constant. Therefore, the continual improvement in semiconductor IC performance and functionality is dependent upon developing materials with low k values.

Since the substance with the lowest dielectric constant is air (k=1.0), low-k dielectric materials typically comprise porous materials. Also, air-gaps are formed to further reduce the effective k value of interconnect structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure that comprises air gaps therein and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
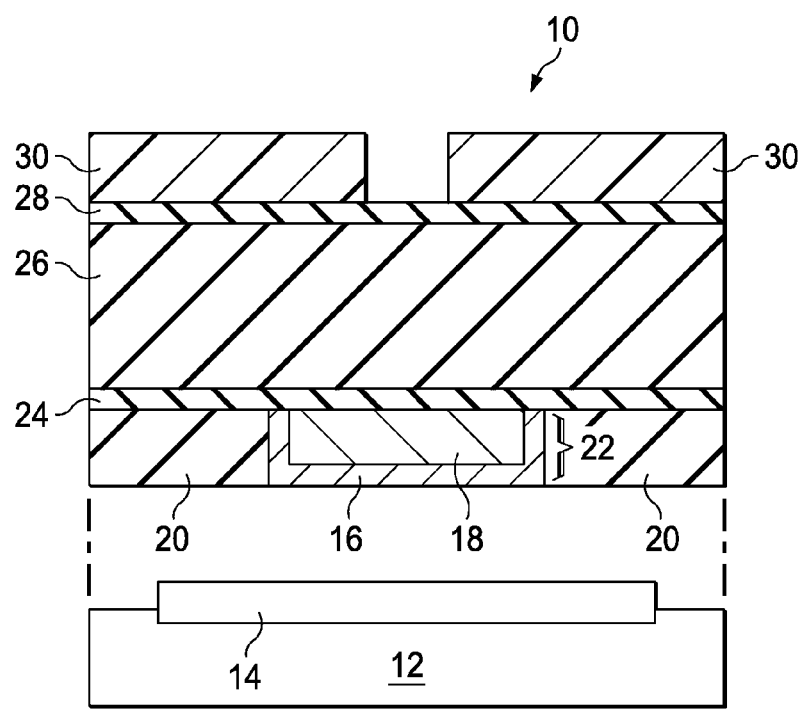
FIGS. 1 through 10 include cross-sectional views and a top view of intermediate stages in the manufacturing of an interconnect structure in accordance with some exemplary embodiments, wherein the interconnect structure includes air gaps.

FIG. 1 illustrates wafer 10, which includes semiconductor substrate 12. In some embodiments, semiconductor substrate 12 is a bulk semiconductor substrate. In alternative embodiments, semiconductor substrate 12 is a Semiconductor-On-Insulator (SOI) substrate. The semiconductor material in semiconductor substrate 12 may comprise silicon, silicon germanium, silicon carbon, a III-V compound semiconductor material, and/or the like. In some embodiments, integrated circuits 14 are formed at a top surface of semiconductor substrate 12. Integrated circuits 14 may include active devices such as transistors.

Over integrated circuit 14 is dielectric layer 20, and conductive line 22 formed in dielectric layer 20. Dielectric layer 20 may be an Inter-Layer Dielectric (ILD) layer or an Inter-Metal Dielectric (IMD) layer, and may have a low dielectric constant (k value) lower than about 2.5, for example. Conductive line 22 may include conductive barrier layer 16 and metal line 18 over barrier layer 16. In some embodiments, barrier layer 16 comprises titanium, titanium nitride, tantalum, tantalum nitride, copper manganese, alloys thereof, and/or multi-layers thereof. Metal line 18 may comprise copper, tungsten, aluminum, nickel, and/or alloys thereof. Conductive line 22 may be electrically coupled to integrated circuits 14, and may serve as the interconnection between the devices in integrated circuits 14.

Etch Stop Layer (ESL) 24 is formed over dielectric layer 20 and conductive line 22. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HD-PCVD), Atomic Layer CVD (ALCVD), and the like. In alternative embodiments, dielectric layer 24 is a diffusion barrier layer that is used for preventing undesirable elements, such as copper, from diffusing through. In further embodiments, dielectric layer 24 acts as both an etch stop layer and a diffusion barrier layer.

FIG. 1 also illustrates the formation of low-k dielectric layer 26, which provides insulation between conductive line 22 and the overlying conductive lines that will be formed subsequently. Low-k dielectric layer 26 is sometimes referred to as an Inter-Metal Dielectric (IMD) layer. Low-k dielectric layer 26 may have a k value lower than about 3.5, or lower than about 2.5. The materials comprised in low-k dielectric layer 26 may include a carbon-containing material, organosilicate glass, a porogen-containing material, and/or combinations thereof. Low-k dielectric layer 26 may be deposited using PECVD, although other commonly used deposition methods, such as Low Pressure CVD (LPCVD), ALCVD, and spin-on, can also be used.

Hard mask layer 28 is formed over low-k dielectric layer 26. Hard mask layer 28 may be a dielectric layer. In some embodiments, hard mask layer 28 comprises silicon nitride, silicon carbide, titanium nitride, or the like. Photo resist 30 is formed over hard mask layer 28, and is then patterned. It is appreciated that although one photo resist 30 is illustrated, in alternative embodiments, a plurality of layers may be included, which includes, and is not limited to, a bottom layer (such as a carbon-containing material), a middle layer (such as a silicon-containing material, for example), an anti-reflective coating, and/or the like.

Figure 2:
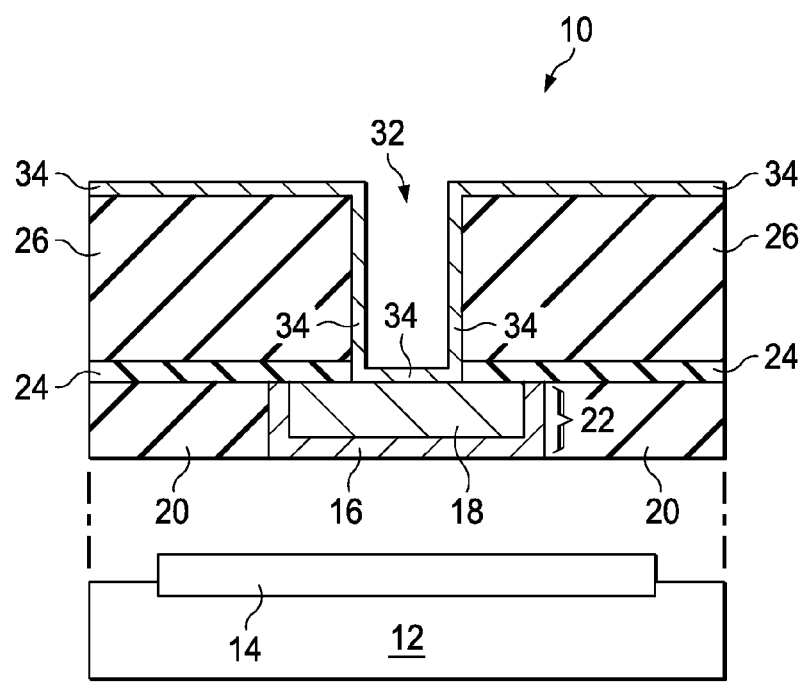

FIG. 2 illustrates the formation of via opening 32 in low-k dielectric layer 26. The formation of via opening 32 includes etching hard mask 28 (FIG. 1), and then etching low-k dielectric layer 26 using the patterned hard mask 28 as an etching mask. ESL 24 is then etched to expose the underlying conductive line 22.

Next, as also shown in FIG. 2, conductive barrier layer 34 is formed. Conductive barrier layer 34 extends into via opening 32, and includes a portion over low-k dielectric layer 26. Conductive barrier layer 34 also has a bottom portion contacting the top surface of conductive line 22. Barrier layer 34 may prevent the copper in the subsequently formed conductive material 36 (FIG. 3) from diffusing into low-k dielectric layer 26. In some embodiments, conductive barrier layer 34 is formed of a conductive material comprising titanium, titanium nitride, tantalum, tantalum nitride, copper manganese, alloys thereof, or multi-layers thereof.

Figure 3:
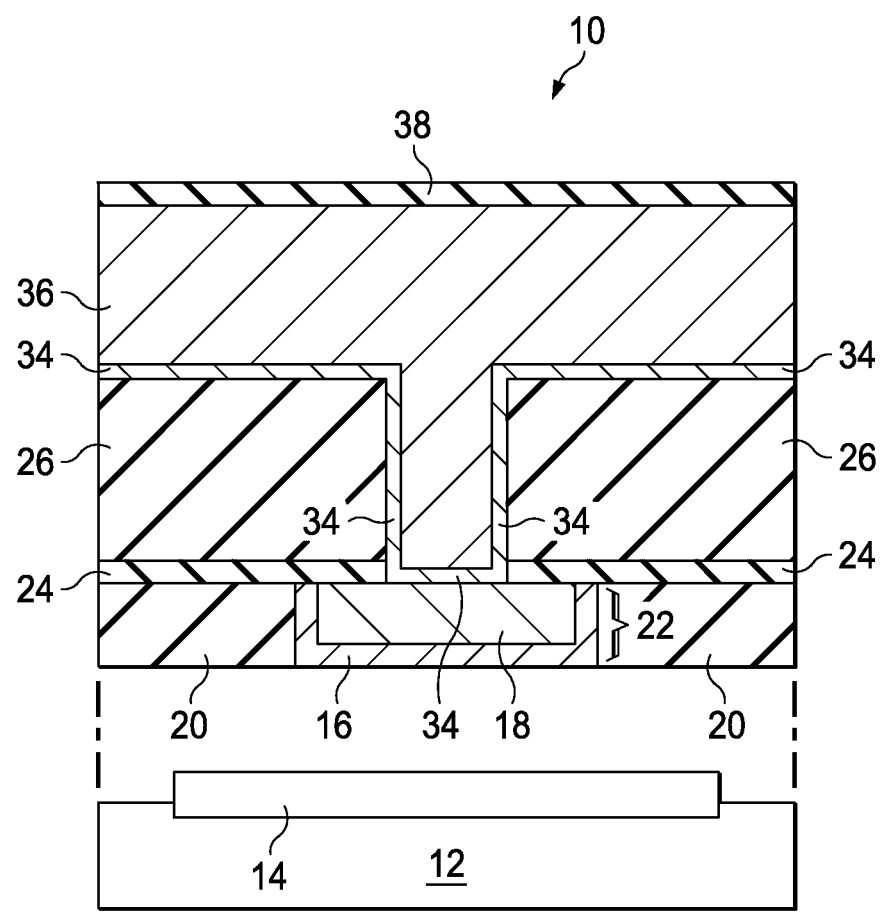

Referring to FIG. 3, conductive material 36 is formed. In some embodiments, conductive material 36 comprises copper, and may be formed of either substantially pure copper or a copper compound. Conductive material 36 is hence accordingly referred to as a copper-comprising material, although conductive material 36 may also be a non-copper material comprising aluminum, tungsten, and/or the like. The top surface of conductive material 36 is higher than the top surface of conductive barrier layer 34. The formation of copper-comprising material 36 may include plating, Metal Organic Chemical Vapor Deposition (MOCVD), or the like. A planarization may be performed to flatten the top surface of copper-comprising material 36. Next, hard mask 38, which may be formed of a material selected from the same group of candidate materials of hard mask 28, is formed over copper-comprising material 36.

Figure 4:
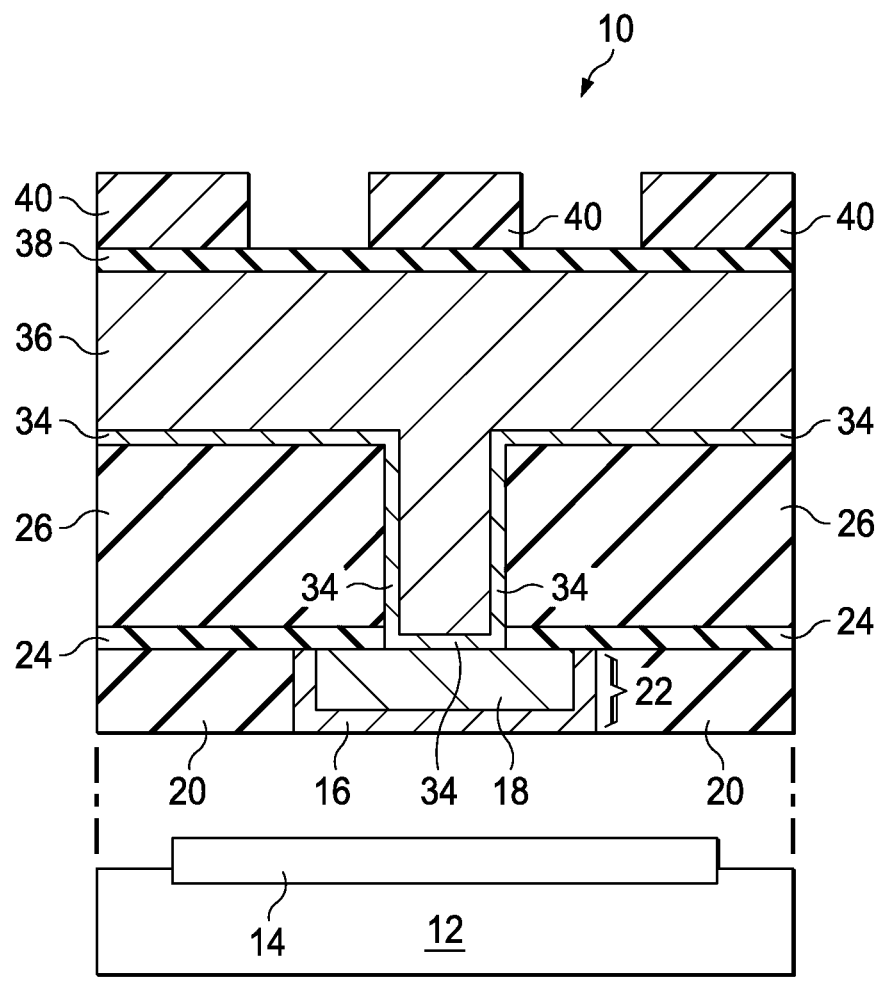
Figure 5:
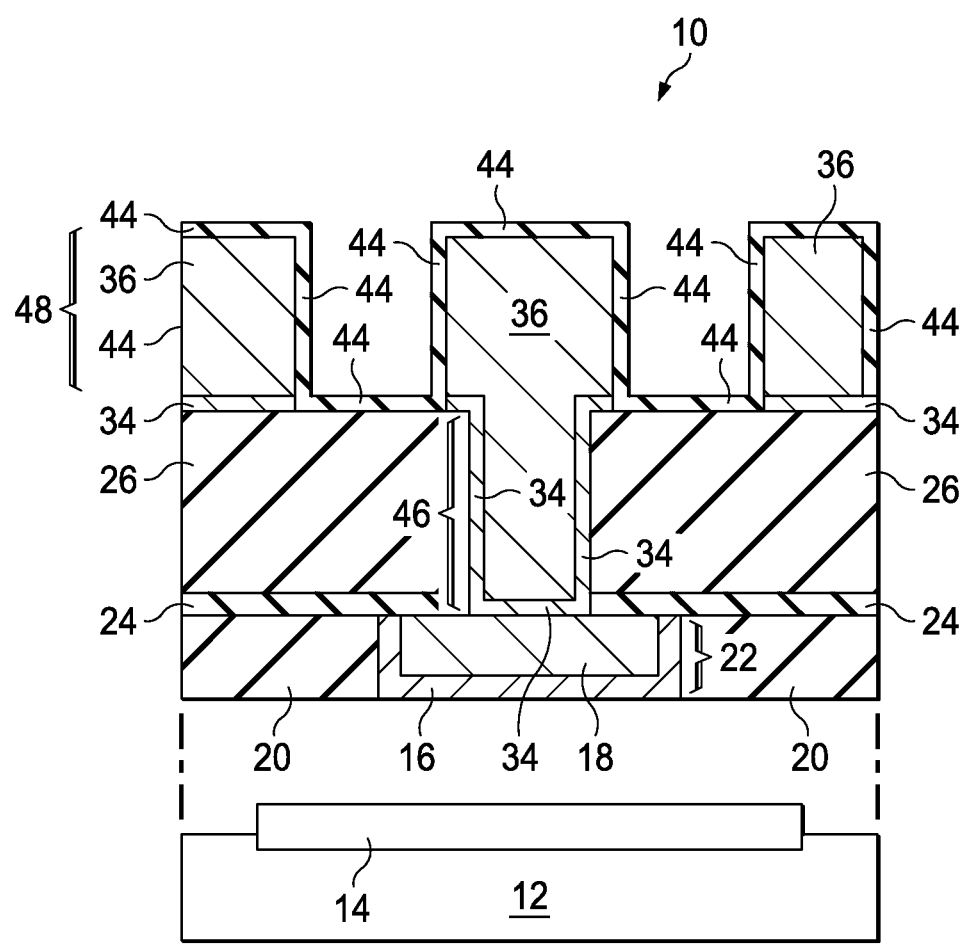

FIG. 4 illustrates the formation and the patterning of photo resist 40. Similar to photo resist 30 in FIG. 1, the illustrated photo resist 40 may represent a plurality of layers including, and not limited to, a bottom layer, a middle layer, an anti-reflective coating, and/or the like. Next, the pattern of photo resist 40 is transferred to the underlying hard mask 38, and then to copper-comprising material 36 and to barrier 34, followed by the removal of photo resist 40 and hard mask 38. The portions of barrier 34 exposed to the openings in photo resist 40 are thus removed. The resulting structure is shown in FIG. 5. The patterning of copper-comprising material 36 may be performed by etching. Dielectric barrier layer 44 is then formed, for example, by deposition. Dielectric barrier layer 44 may be formed of a dielectric material, which may comprise silicon nitride, silicon carbide, silicon oxynitride, carbon nitride, carbon oxide, combinations thereof, and/or multi-layers thereof. After the patterning of copper-comprising material 36, a portion of copper-comprising material 36 in low-k dielectric layer 26 forms via 46 along with the contacting portion of conductive barrier layer 34. The portion of copper-comprising material 36 (that is over low-k dielectric layer 26) and the respective contacting dielectric barrier layer 44 form metal lines 48.

Figure 6:
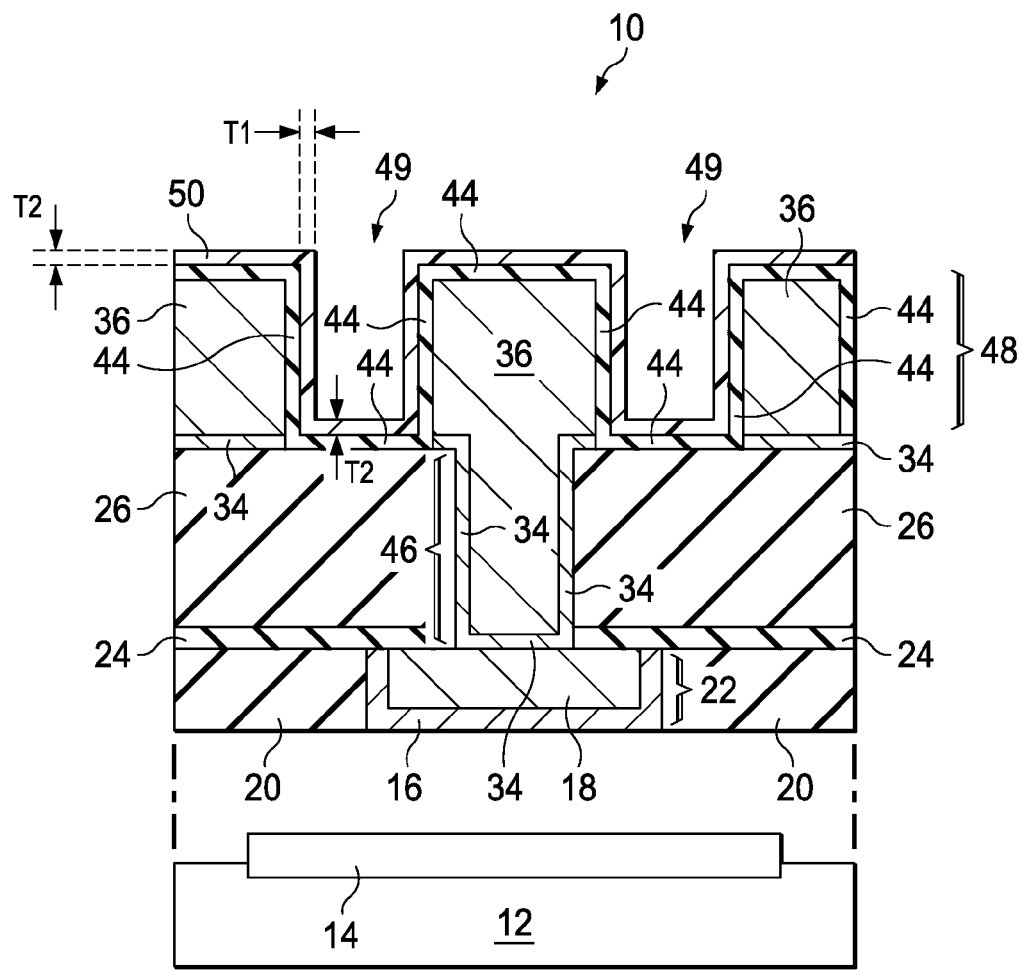

Referring to FIG. 6, decomposable layer 50 is formed over metal lines 48, and in the spaces 49 (also referred to as openings 49) between metal lines 48. In some embodiments, decomposable layer 50 includes a polymer that may decompose and vaporize when exposed to Ultra-Violet light and/or heated to an elevated temperature, for example, between 250° C. and 500° C. Exemplary materials of decomposable layer 50 include P (neopentul methacrylate-co-ethylene glycol dimethacrylate) copolymer, polypropylene glycol (PPG), polybutadine (PB), polyethylene glycol (PEG), polycaprolactone diol (PCL), fluorinated amorphous carbon (a-FiC), silicon gel and/or organic silaxone. Decomposable layer 50 may be formed by spin coating or a deposition process such as a Chemical Vapor Deposition (CVD) process. Alternatively, decomposable layer 50 is formed using Plasma Enhanced Atomic Layer Deposition (PEALD) at a low temperature, for example, between about 30° C. and about 50° C. The PEALD may result in a good conformal profile for decomposable layer 50.

Decomposable layer 50 may be formed as a conformal layer, wherein thickness T1 of the vertical portions of decomposable layer 50 is close to thickness T2 of the horizontal portions of decomposable layer 50. Ratio T1/T2 may also be between about 0.7 and about 1, between about 0.8 and about 1, or between about 0.9 and about 1. Thicknesses T1 and T2 may be between about 5 nm and about 20 nm in some exemplary embodiments. It is appreciated, however, that the values recited throughout the description are merely examples, and may be changed to different values.

Figure 7:
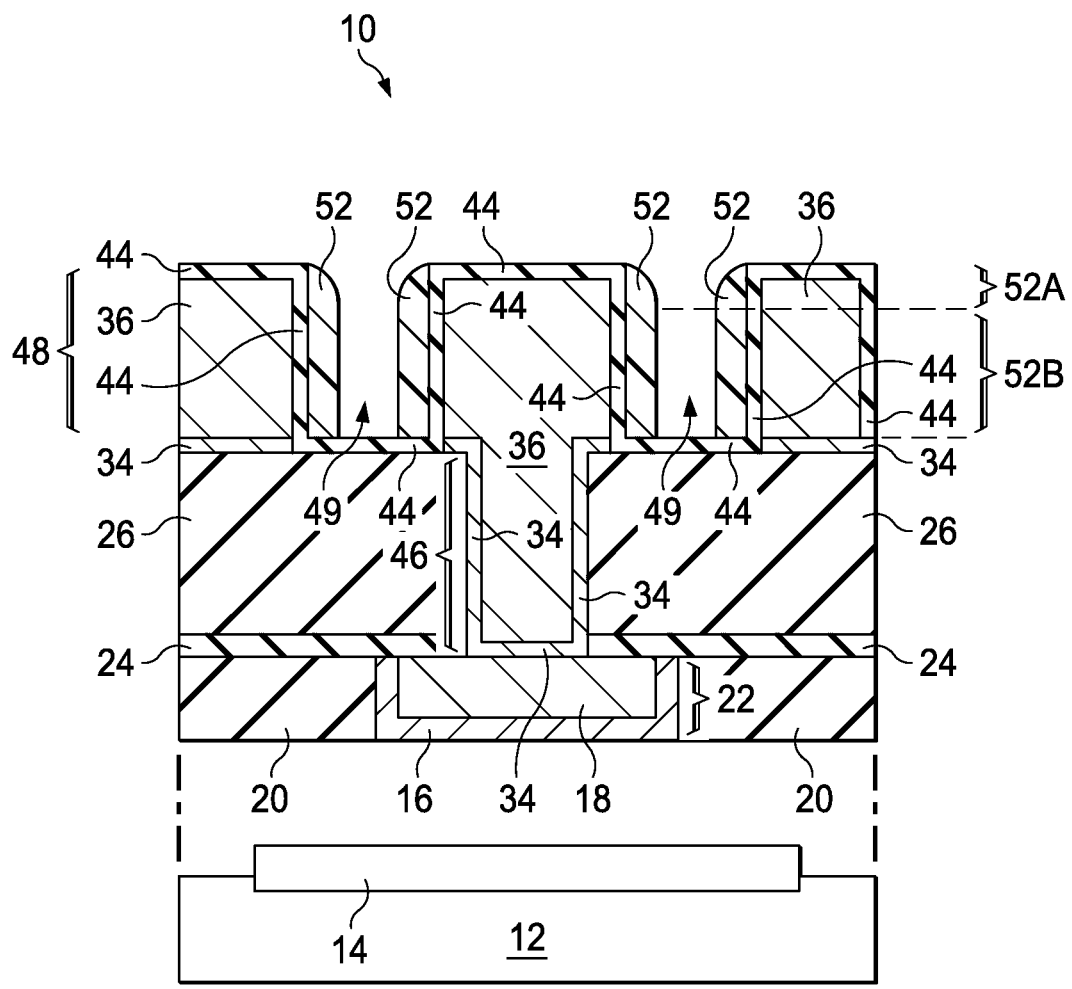

Decomposable layer 50 is then etched. The horizontal portions of decomposable layer 50 are removed, and the vertical portions of decomposable layer 50 on the sidewalls of metal lines 48 are left, forming decomposable spacers 52, as shown in FIG. 7. The etching may be an anisotropic etching, and may be a dry etching, for example. As a result of the anisotropic etching, the upper portions 52A of decomposable spacers 52 may have a tapered profile, with lower thicknesses of decomposable spacers 52 greater than upper widths. Decomposable spacers 52 may also have lower portions 52B that have substantially vertical sidewalls.

Figure 8:
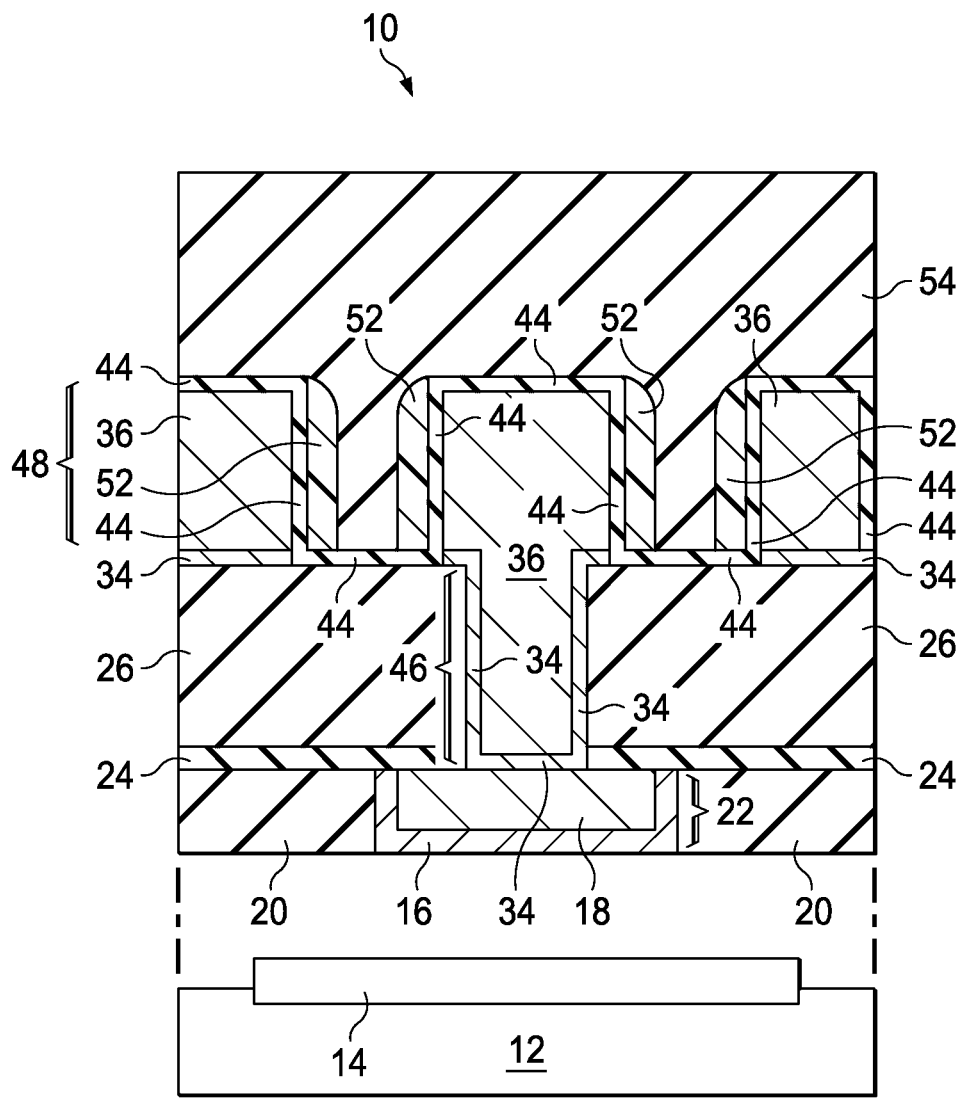

Next, in FIG. 8, low-k dielectric material 54 is formed. Low-k dielectric material 54 may have a k value lower than about 3.0, or lower than about 2.5, and may be formed of carbon-containing low-k dielectric materials, for example. Low-k dielectric material 54 is porous. Openings 49 (FIG. 7) between metal lines 48 are filled with lower portions of low-k dielectric material 54. Furthermore, low-k dielectric material 54 may include an upper portion over and contacting dielectric barrier layer 44, which are top surface portions of metal lines 48. The lower portions and the upper portions of low-k dielectric material 54 are formed in a same formation process, and hence there is no visible interface therebetween. Low-k dielectric material 54 may be formed using spin-on coating to take the advantage of its good gap filling capability, so that trenches 49 are filled with substantially no void therein, and the upper portion of low-k dielectric material 54 may have a substantially planar top surface.

Figure 9A:
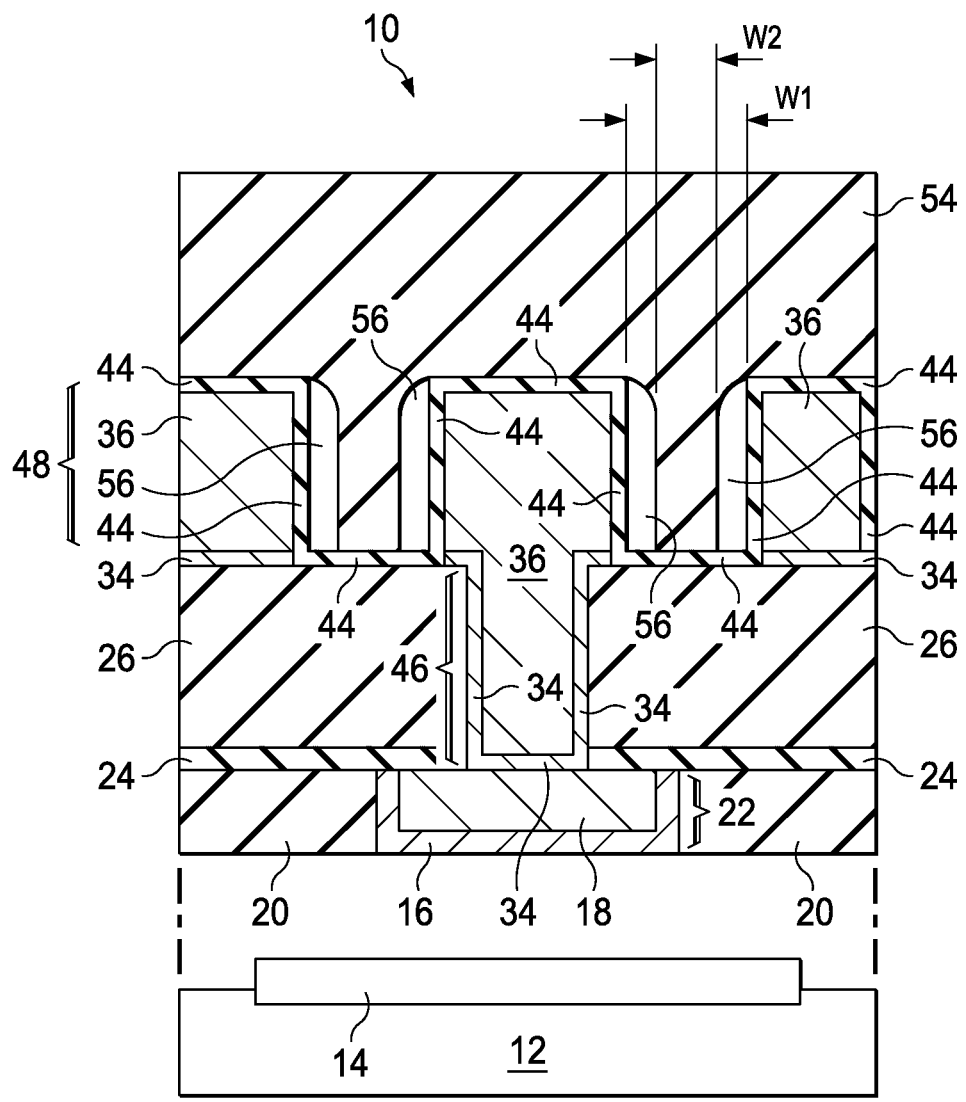

As shown in FIG. 9A, decomposable spacers 52 are decomposed and turned into a vapor with molecules small enough to diffuse through the pores of low-k dielectric material 54. Air-gaps 56 are thus formed. The decomposition and vaporization may be performed through an UV exposure and/or a heating process at an elevated temperature. In some exemplary embodiments, decomposable spacers 52 include decomposable layer 50 that includes P (neopentul methacrylate-co-ethylene glycol dimethacrylate) copolymer. The vaporization may thus be performed with a UV exposure, and the corresponding heating temperature may be between about 250° C. and about 500° C.

As a result of the vaporization, air gaps 56 are formed. Air gaps 56 may have essentially the same profile as that of decomposable spacers 52 in FIG. 8, for example, having the tapered upper portions, and lower portions having substantially vertical sidewalls. Low-k dielectric material 54 comprises edges exposed to air gaps 56. Furthermore, some vertical portions of conductive barrier layer 34 may be exposed to air gaps 56. The top ends of air gaps 56 may be substantially level with, or lower than, the top surfaces of metal lines 48. Low-k dielectric material 54 includes a lower portion between metal lines 48, and an upper portion over the lower portion of low-k dielectric material 54 and metal lines 48. At the level lower than and close to the level of the top surfaces of metal lines 48, the lower portion of low-k dielectric material 54 may have a tapered profile, and have lower widths W2 increasingly greater than the respective upper widths W1.

Figure 9B:
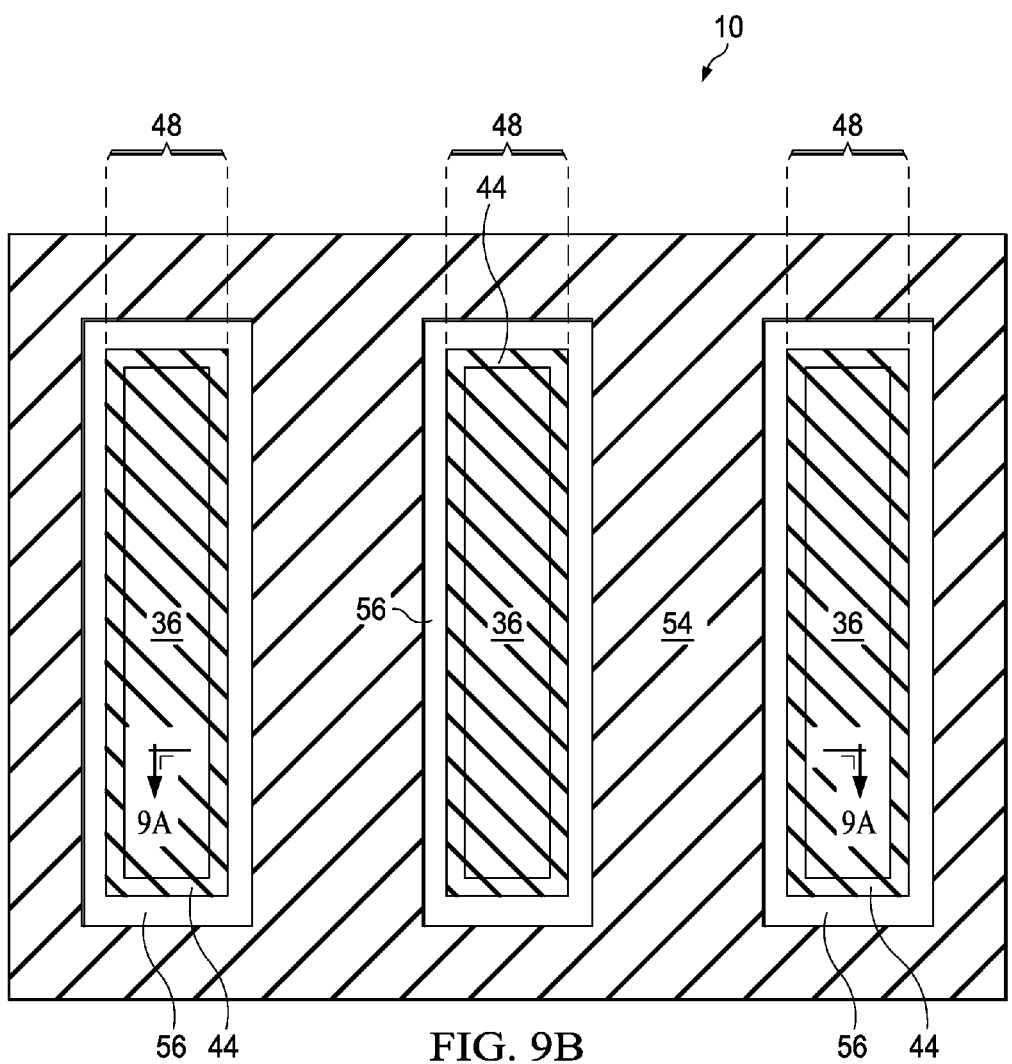

FIG. 9B illustrates a top view of the structure in FIG. 9A. It is shown that each of air gaps 56 may form a continuous air gap ring encircling one of metal lines 48. In the top-view, low-k dielectric material 54 further encircles air gap rings 56.

Figure 10:
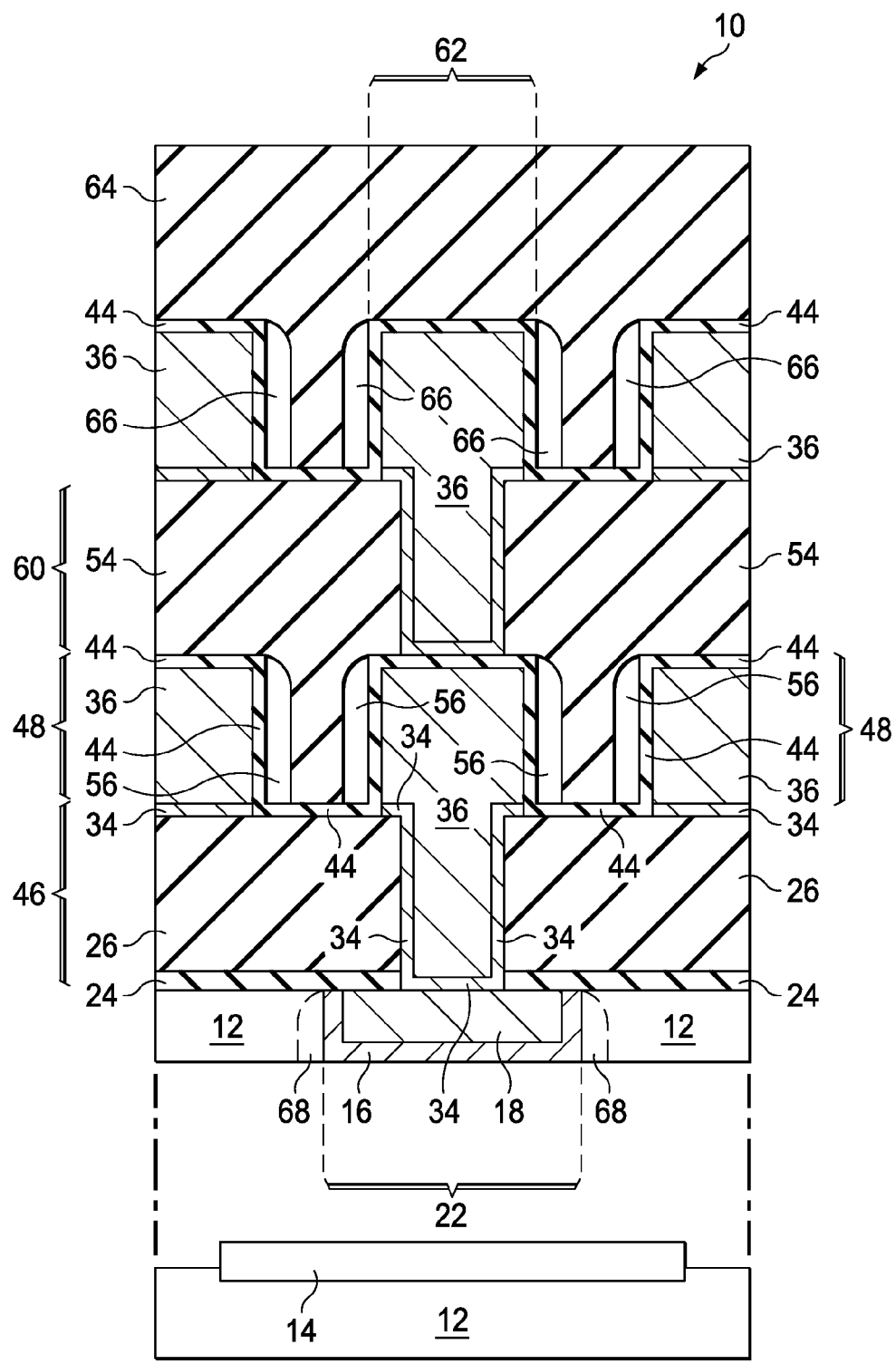

FIG. 10 illustrates additional via 60 over metal lines 48 and in low-k dielectric material 54, and metal lines 62 over via 60 in low-k dielectric material 64. Via 60 is electrically coupled to the respective underlying metal line 48. Air gaps 66 may be formed on the sidewalls of, and encircle, metal lines 62. The formation processes may be essentially the same as in FIGS. 2 through 9A, and are not repeated herein.

In the previously discussed embodiments, the metal lines and the underlying vias are formed simultaneously. Similar process and materials as discussed in the embodiments can also be adopted in the formation of metal lines with no underlying vias. For example, as shown in FIG. 10, air gaps 68 may also be formed to encircle conductive line 22. The formation process may be realized through the teaching of the embodiments.

In the embodiments, air gaps are formed in the interconnect structures. Since air gaps have a k value equal to 1, the equivalent k value of the dielectric material in the interconnect structures is lowered, resulting in a reduction in the parasitic capacitance between metal lines 48 (FIG. 10). The formation of the air gaps is uniform and controllable, and does not suffer from the permeable (porous) hard mask collapsing problem that may occur in conventional methods for forming the air gaps.

In accordance with embodiments, a structure includes a substrate, and a first metal line and a second metal line over the substrate, with a space therebetween. A first air gap is on a sidewall of the first metal line and in the space, wherein an edge of the first metal line is exposed to the first air gap. A second air gap is on a sidewall of the second metal line and in the space, wherein an edge of the second metal line is exposed to the second air gap. A dielectric material is disposed in the space and between the first and the second air gaps.

In accordance with other embodiments, a structure includes a substrate, and a metal line over the substrate. The metal line includes a copper-containing line, and a dielectric barrier layer having a top portion over and contacting the first metal line, and an edge portion contacting a sidewall of the first metal line. An air gap encircles the metal line, wherein the edge portion of the dielectric barrier layer is exposed to the air gap. A low-k dielectric region has a sidewall exposed to the first air gap.

In accordance with yet other embodiments, a method includes forming a conductive region, etching the conductive region to form an opening in the conductive region, and forming a decomposable layer. The decomposable layer includes a top portion over the conductive region, a sidewall portion on a sidewall of the conductive region, and a bottom portion at a bottom of the opening. The decomposable layer is etched to remove the top portion and the bottom portion of the decomposable layer. A low-k dielectric layer is formed in a remaining portion of the opening. The sidewall portion of the decomposable layer is decomposed to form an air gap.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising:
a substrate;
a first metal line and a second metal line over the substrate, with a space therebetween, wherein the first metal line comprises:
a metal-containing feature; and
a dielectric barrier layer comprising an edge portion contacting a sidewall of the metal-containing feature, and a top portion contacting a top surface of the metal-containing feature;
a first air gap on a sidewall of the first metal line and in the space, wherein an edge of the first metal line is exposed to the first air gap, with the edge of the first metal line being a vertical straight edge, and wherein the first air gap has a tapered profile, with lower widths of an upper portion of the first air gap increasingly greater than upper widths of the upper portion of the first air gap;
a second air gap on a sidewall of the second metal line and in the space, wherein an edge of the second metal line is exposed to the second air gap, wherein the dielectric barrier layer further comprises a bottom portion extending underlying the first and the second air gaps; and
a dielectric material comprising a lower portion in the space and between the first and the second air gaps, wherein the lower portion of the dielectric material is over and in contact with the bottom portion of the dielectric barrier layer.

2. The structure of claim 1, wherein the first air gap forms a continuous air gap ring encircling the first metal line.

3. The structure of claim 1, wherein the dielectric material further comprises an upper portion overlying the lower portion and the first and the second metal lines, wherein the lower portion and the upper portion are formed of a same material, and wherein no visible interface is located between the lower portion and the upper portion of the dielectric material.

4. The structure of claim 1, wherein a lower portion the first air gap comprises a substantially vertical sidewall.

5. The structure of claim 1, wherein the lower portion of the dielectric material comprises an edge exposed to the first air gap, wherein the edge of the lower portion of the dielectric material and the edge of the first metal line are opposite edges of the first air gap, and wherein the edge of the lower portion of the dielectric material is more curved than the edge of the first metal line.

6. The structure of claim 1, wherein the dielectric material and the dielectric barrier layer are formed of different dielectric materials.

7. The structure of claim 1, wherein metal-containing feature comprises copper.

8. A structure comprising:
a substrate;
a first metal line over the substrate, wherein the first metal line comprises:
a copper-containing line; and
a dielectric barrier layer comprising a top portion over and contacting the first metal line, and an edge portion contacting a sidewall of the first metal line;
a first air gap encircling the first metal line, wherein the edge portion of the dielectric barrier layer comprises an edge exposed to the first air gap; and
a low-k dielectric region comprising a lower portion, wherein the lower portion comprises a sidewall exposed to the first air gap, and wherein the sidewall of the lower portion of the low-k dielectric region is more curved than the edge of the edge portion of the dielectric barrier layer.

9. The structure of claim 8, wherein the low-k dielectric region further comprises an upper portion continuously connected to the lower portion, with no visible interface between the upper portion and the lower portion, and wherein the upper portion of the low-k dielectric region is overlying the first metal line.

10. The structure of claim 9, wherein the upper portion of the low-k dielectric region comprises a bottom surface contacting the top portion of the dielectric barrier layer.

11. The structure of claim 8, wherein the lower portion of the low-k dielectric region has a tapered profile, with a lower width of the lower portion smaller than an upper width of the lower portion of the low-k dielectric region.

12. The structure of claim 8, wherein a top end of the air gap is level with or lower than a top surface of the top portion of the dielectric barrier layer, and wherein the dielectric barrier layer further comprises a bottom portion underlying and exposed to the first air gap.

13. The structure of claim 12, wherein the bottom portion of the dielectric barrier layer is further underlying and contacting the lower portion of the low-k dielectric region.

14. The structure of claim 8 further comprising:
   a second metal line over the substrate and level with the first metal line, wherein the dielectric barrier layer further comprises an additional top portion over and contacting the second metal line, and an additional edge portion contacting a sidewall of the second metal line; and
   a second air gap encircling the second metal line, wherein the additional edge portion of the dielectric barrier layer is exposed to the second air gap, and wherein an additional sidewall of the lower portion of the low-k dielectric region is further exposed to the second air gap.

15. A structure comprising:
   a substrate;
   a first low-k dielectric layer over the substrate;
   a conductive barrier comprising:
      a first portion over and contacting a top surface of the low-k dielectric layer; and
      a second portion extending into the low-k dielectric layer, wherein the second portion comprises sidewall portions on sidewalls of the first low-k dielectric layer;
   a via between the sidewall portions of the conductive barrier;
   a first metal line over and connected to the via, wherein edges of the first metal line are aligned to edges of the first portion of the conductive barrier;
   a dielectric barrier layer comprising a top portion over and contacting the first metal line, and edge portions contacting opposite sidewalls of the first metal line; and
   a first air gap encircling the first metal line, wherein the edge portions of the dielectric barrier layer are exposed to the first air gap.

16. The structure of claim 15 further comprising a second low-k dielectric layer comprising a lower portion, wherein the lower portion comprises a sidewall exposed to the first air gap.

17. The structure of claim 16, wherein the second low-k dielectric layer further comprises an upper portion, with a bottom surface of the upper portion of the second low-k dielectric layer contacting a top surface of the top portion of the dielectric barrier layer.

18. The structure of claim 15, wherein the first portion of the conductive barrier comprises a first edge aligned to a second edge of the first metal line, wherein the first edge contacts the dielectric barrier layer.

19. The structure of claim 16, wherein the lower portion of the second low-k dielectric layer comprises a bottom surface contacting a top surface of the first portion of the dielectric barrier layer.

20. The structure of claim 15, wherein a portion of the metal line extends beyond a respective edge of the via, with the second portion of the conductive barrier on the respective edge of the via, and wherein the portion of the metal line comprises a bottom surface contacting the first portion of the conductive barrier.

* * * * *